US012267952B2

(12) United States Patent
Ikebe et al.

(10) Patent No.: US 12,267,952 B2
(45) Date of Patent: Apr. 1, 2025

(54) FLEXIBLE PRINTED WIRING BOARD AND METHOD OF MANUFACTURING THE SAME

(71) Applicants: SUMITOMO ELECTRIC INDUSTRIES, LTD., Osaka (JP); SUMITOMO ELECTRIC PRINTED CIRCUITS, INC., Koka (JP)

(72) Inventors: Maki Ikebe, Osaka (JP); Koji Nitta, Osaka (JP); Shoichiro Sakai, Osaka (JP); Shingo Nagata, Osaka (JP); Junichi Motomura, Koka (JP); Masahiro Itoh, Koka (JP)

(73) Assignees: SUMITOMO ELECTRIC INDUSTRIES, LTD., Osaka (JP); SUMITOMO ELECTRIC PRINTED CIRCUITS, INC., Koka (JP)

( * ) Notice: Subject to any disclaimer, the term of this patent is extended or adjusted under 35 U.S.C. 154(b) by 224 days.

(21) Appl. No.: 17/791,931

(22) PCT Filed: Jun. 23, 2021

(86) PCT No.: PCT/JP2021/023701
§ 371 (c)(1),
(2) Date: Jul. 11, 2022

(87) PCT Pub. No.: WO2022/009675
PCT Pub. Date: Jan. 13, 2022

(65) Prior Publication Data
US 2023/0050814 A1    Feb. 16, 2023

(30) Foreign Application Priority Data
Jul. 8, 2020 (JP) .................. 2020-117888

(51) Int. Cl.
*H05K 1/02*     (2006.01)

(52) U.S. Cl.
CPC ........... *H05K 1/0296* (2013.01); *H05K 1/028* (2013.01)

(58) Field of Classification Search
CPC ......... H05K 1/02; H05K 1/0296; H05K 1/028
(Continued)

(56) References Cited

U.S. PATENT DOCUMENTS

2005/0274689 A1   12/2005   Sakata et al.
2008/0171138 A1   7/2008   Sakata et al.
(Continued)

FOREIGN PATENT DOCUMENTS

CN    1697592 A    11/2005
CN    107924253 A    4/2018
(Continued)

*Primary Examiner* — Tremesha W Burns
(74) *Attorney, Agent, or Firm* — Oliff PLC

(57) ABSTRACT

A flexible printed wiring board according to an aspect of the present disclosure is a flexible printed wiring board including a base film and a plurality of wiring lines disposed on a front surface of the base film. Each of the wiring lines has a front end surface extending in a longitudinal direction of the wiring line and two side surfaces extending in the longitudinal direction, and the side surfaces have an arithmetical mean roughness Ra of 0.05 μm to 2.0 μm. The wiring lines have an average height of 40 μm to 120 μm. The wiring lines have an average spacing of 1 μm to 30 μm.

7 Claims, 6 Drawing Sheets

(58) Field of Classification Search
USPC .......................................................... 174/254
See application file for complete search history.

(56) References Cited

U.S. PATENT DOCUMENTS

| | | |
|---|---|---|
| 2014/0292469 A1 | 10/2014 | Cha et al. |
| 2016/0343654 A1 | 11/2016 | Kojima |
| 2019/0311830 A1 | 10/2019 | Kim |
| 2020/0022262 A1 | 1/2020 | Okamoto et al. |
| 2020/0395165 A1* | 12/2020 | Noo .......................... H01F 1/36 |
| 2021/0392754 A1 | 12/2021 | Okamoto et al. |
| 2022/0061147 A1 | 2/2022 | Kim et al. |

FOREIGN PATENT DOCUMENTS

| | | |
|---|---|---|
| CN | 110612783 A | 12/2019 |
| JP | 2014-192523 A | 10/2014 |
| JP | 2016-219559 A | 12/2016 |
| JP | 2019-186518 A | 10/2019 |
| JP | 2019-197851 A | 11/2019 |
| TW | 202025430 A | 7/2020 |

* cited by examiner

FLEXIBLE PRINTED WIRING BOARD AND METHOD OF MANUFACTURING THE SAME

TECHNICAL FIELD

The present disclosure relates to a flexible printed wiring board and a method of manufacturing the same. This application claims priority based on Japanese Patent Application No. 2020-117888 filed on Jul. 8, 2020, and the entire contents of the Japanese patent application are incorporated herein by reference.

BACKGROUND ART

Flexible printed wiring boards are widely used to constitute circuits of various electronic devices. In recent years, with the size reduction of electronic devices, the size reduction of flexible printed wiring boards and the increase in wiring density of flexible printed wiring boards have been increasingly progressing.

As such a small wiring board, there has been proposed a wiring board that includes a substrate and wiring lines disposed on a surface of the substrate and including a first plating layer and a second plating layer, in which the second plating layer has a surface roughness of 1 nm to 600 nm. According to this wiring board, adhesive strength between the second plating layer and an insulating film covering the second plating layer can be increased (refer to Japanese Unexamined Patent Application Publication No. 2019-186518).

CITATION LIST

Patent Literature

PTL 1: Japanese Unexamined Patent Application Publication No. 2019-186518

SUMMARY OF INVENTION

A flexible printed wiring board according to an aspect of the present disclosure is a flexible printed wiring board including a base film and a plurality of wiring lines disposed on a front surface of the base film. Each of the wiring lines has a front end surface extending in a longitudinal direction of the wiring line and two side surfaces extending in the longitudinal direction, and the side surfaces have an arithmetical mean roughness Ra of 0.05 µm to 2.0 µm. The wiring lines have an average height of 40 µm to 120 µm. The wiring lines have an average spacing of 1 µm to 30 µm.

A method of manufacturing a flexible printed wiring board according to another aspect of the present disclosure is a method of manufacturing a flexible printed wiring board including a base film and a plurality of wiring lines disposed on a front surface of the base film, the wiring lines each having a front end surface extending in a longitudinal direction thereof and two side surfaces extending in the longitudinal direction, the side surfaces having an arithmetical mean roughness Ra of 0.05 µm to 2.0 µm, the wiring lines having an average height of 40 µm to 120 µm, the wiring lines having an average spacing of 1 µm to 30 µm. The method includes a first plating step of preparing a base film having a conductive underlying layer stacked on a front surface thereof, and forming a first plating layer on the conductive underlying layer by electroplating in a first plating solution using a resist pattern; a step of removing the resist pattern and a region of the conductive underlying layer, the region not having the first plating layer thereon; and a second plating step of, after the step of removing, forming a second plating layer on the first plating layer by electroplating in a second plating solution. In the method, the second plating solution contains polyethylene glycol having a number-average molecular weight of 2,500 to 8,000, and the second plating step includes adjusting a current density of the electroplating such that the side surfaces have an arithmetical mean roughness Ra of 0.05 µm to 2.0 µm.

DESCRIPTION OF EMBODIMENTS

Figure 1:
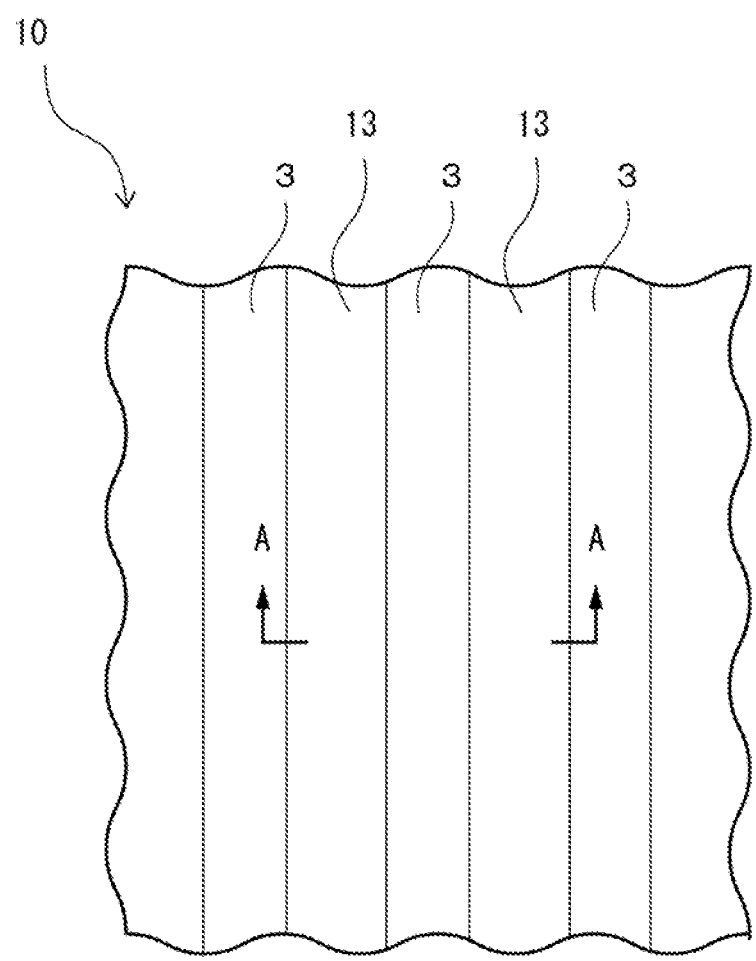
FIG. 1 is a top view of a flexible printed wiring board according to a first embodiment.

Problems to be Solved by Present Disclosure

In the wiring board disclosed in the above patent literature, if the wiring lines have a relatively small spacing therebetween and have a relatively large height thereof, adjacent wiring lines may come in contact with each other, and a short circuit may occur.

An object of the present disclosure is to provide a flexible printed wiring board that has good adhesiveness to an insulating film covering wiring lines and that is less likely to be short-circuited, and a method of manufacturing the flexible printed wiring board.

Advantageous Effects of Present Disclosure

The flexible printed wiring board according to an aspect of the present disclosure has good adhesiveness to an insulating film and is less likely to be short-circuited. The method of manufacturing a flexible printed wiring board according another aspect of the present disclosure enables the manufacturing of a flexible printed wiring board that has good adhesiveness to an insulating film and that is less likely to be short-circuited.

Description of Embodiments of Present Disclosure

A flexible printed wiring board according to an aspect of the present disclosure is a flexible printed wiring board including a base film and a plurality of wiring lines disposed on a front surface of the base film. Each of the wiring lines has a front end surface extending in a longitudinal direction of the wiring line and two side surfaces extending in the longitudinal direction, and the side surfaces have an arithmetical mean roughness Ra of 0.05 µm to 2.0 µm. The wiring lines have an average height of 40 µm to 120 µm. The wiring lines have an average spacing of 1 µm to 30 µm.

In the flexible printed wiring board, since the arithmetical mean roughness Ra of the side surfaces is within the range described above, and the average height and the average spacing of the wiring lines are within the ranges described above, a short circuit can be suppressed. In addition, when an insulating film is stacked so as to cover the wiring lines, adhesiveness between the insulating film and the wiring lines can be increased. Thus, the flexible printed wiring board has good adhesiveness to an insulating film and is less likely to be short-circuited.

The front end surface may have an arithmetical mean roughness Ra of 0.05 µm to 2.0 µm.

When the arithmetical mean roughness Ra of the front end surface is within the range described above, adhesiveness between an insulating film and the wiring lines can be further increased. Thus, the flexible printed wiring board has better adhesiveness to an insulating film.

The wiring lines may have an average line width of 5 µm to 30 µm.

In the wiring lines having an average line width within the range described above, adhesiveness between an insulating film and the wiring lines can also be further increased. Thus, the superiority of the flexible printed wiring board is enhanced.

The wiring lines may have an average height of 40 µm to 60 µm.

Since the average height is within the range described above, adhesiveness between an insulating film and the wiring lines can be further increased, and a short circuit can be suppressed. Thus, the superiority of the flexible printed wiring board is enhanced.

A width of each of the wiring lines increases from the front surface of the base film toward the front end surface in a section perpendicular to the longitudinal direction. This feature provides good adhesiveness to an insulating film covering the wiring lines.

Each of the wiring lines includes a first conductive underlying layer stacked on the front surface of the base film, a first plating layer stacked on a surface of the first conductive underlying layer opposite to the base film, and a second plating layer stacked so as to cover both side surfaces of the first conductive underlying layer, a surface of the first plating layer opposite to the first conductive underlying layer, and both side surfaces of the first plating layer, and a front end surface and side surfaces of the second plating layer respectively correspond to the front end surface and the side surfaces of the wiring line.

A thickness of the second plating layer in a direction perpendicular to the side surfaces of the first plating layer increases from a contact surface between the front surface of the base film and the second plating layer towards the front end surface. This feature provides good adhesiveness to an insulating film covering the wiring lines.

Each of the wiring lines includes a second conductive underlying layer stacked on the front surface of the base film, and a third plating layer stacked on a surface of the second conductive underlying layer opposite to the base film, and a front end surface of the third plating layer corresponds to the front end surface of the wiring line, and side surfaces of the second conductive underlying layer and the third plating layer correspond to the side surfaces of the wiring line.

A method of manufacturing a flexible printed wiring board according to another aspect of the present disclosure is a method of manufacturing a flexible printed wiring board including a base film and a plurality of wiring lines disposed on a front surface of the base film, the wiring lines each having a front end surface extending in a longitudinal direction thereof and two side surfaces extending in the longitudinal direction, the side surfaces having an arithmetical mean roughness Ra of 0.05 µm to 2.0 µm, the wiring lines having an average height of 40 µm to 120 µm, the wiring lines having an average spacing of 1 µm to 30 µm. The method includes a first plating step of preparing a base film having a conductive underlying layer stacked on a front surface thereof, and forming a first plating layer on the conductive underlying layer by electroplating in a first plating solution using a resist pattern; a step of removing the resist pattern and a region of the conductive underlying layer, the region not having the first plating layer thereon; and a second plating step of, after the step of removing, forming a second plating layer on the first plating layer by electroplating in a second plating solution. In the method, the second plating solution contains polyethylene glycol having a number-average molecular weight of 2,500 to 8,000, and the second plating step includes adjusting a current density of the electroplating such that the side surfaces have an arithmetical mean roughness Ra of 0.05 µm to 2.0 µm.

According to the method of manufacturing a flexible printed wiring board, the flexible printed wiring board described above can be manufactured. That is, the method enables the manufacturing of a flexible printed wiring board that has good adhesiveness between wiring lines and an insulating film covering the wiring lines and that is less likely to be short-circuited.

The second plating step preferably includes adjusting the current density in two stages.

When the current density is adjusted in two stages in the second plating step, the arithmetical mean roughness Ra is easily adjusted within the range described above.

The "height direction" as used herein means a direction perpendicular to a surface of a base film on which wiring lines are formed. The "average height of wiring lines" means an average of heights measured at ten random positions of one wiring line. The "height" means a distance from the base film to a top edge of a wiring line in the direction perpendicular to the surface of the base film. The "height" corresponds to a "thickness".

The "spacing" between wiring lines means a distance between adjacent surfaces of two wiring lines facing each other. The "average spacing" means a value obtained by exposing a wiring line section perpendicular to a longitudinal direction with a section preparation device such as a microtome, measuring a distance between adjacent surfaces at ten random positions by cross-sectional observation, and averaging the distances. The "line width" of a wiring line means a dimension of a width in a direction perpendicular to the longitudinal direction of the wiring line. The "average line width" means a value obtained by exposing a wiring line section with a section preparation device such as a microtome, measuring the maximum width at ten random positions by cross-sectional observation, and averaging the maximum widths.

However, with regard to land parts such as a land part having a via (through-hole, blind via, or filled via) for connecting wiring lines to each other, a land part that is connected to a mounted component, and a land part for connecting to another printed board or connector, these parts are excluded from the "height", the "line width" and the "spacing" defined above.

The "arithmetical mean roughness Ra of a side surface" means a arithmetical mean roughness Ra of the entirety of each side surface of each wiring line. The "arithmetical mean roughness Ra of a front end surface" means a arithmetical mean roughness Ra of the entirety of a front end surface of each wiring line. The "arithmetical mean roughness Ra" as used herein refers to a value obtained by measuring an arithmetical mean roughness Ra at five random positions on a side surface or a front end surface of a wiring line, and averaging the measured values. Each arithmetical mean roughness Ra at five random positions means a value determined as follows. From a roughness profile at each position, only a portion having a sampling length (L) and extending from a position 0 to a position L in the direction of the mean line of the roughness profile is sampled. The X-axis is taken in the direction of the mean line of the sampled portion, the Y-axis is taken in the direction of vertical magnification, and the roughness profile is represented by y=f(x). In this case, a value determined by the following formula (1) is represented in units of micrometers (μm) and defined as the arithmetical mean roughness Ra. A specific measurement method will be described in Examples.

[Math. 1]

$$R_a = \frac{1}{L} \int_0^L |f(x)| dx \quad (1)$$

[Details of Embodiments of Present Disclosure]

A flexible printed wiring board and a method of manufacturing the flexible printed wiring board according to embodiments of the present disclosure will be described in detail below with reference to the drawings. Note that the term "front surface" in the present embodiments refers to, in the height direction of a base film, a surface on a side of the base film on which wiring lines are stacked, and the front and back in the embodiments do not define the front and back of the flexible printed wiring board during use.

First Embodiment

[Flexible Printed Wiring Board]

Figure 2:
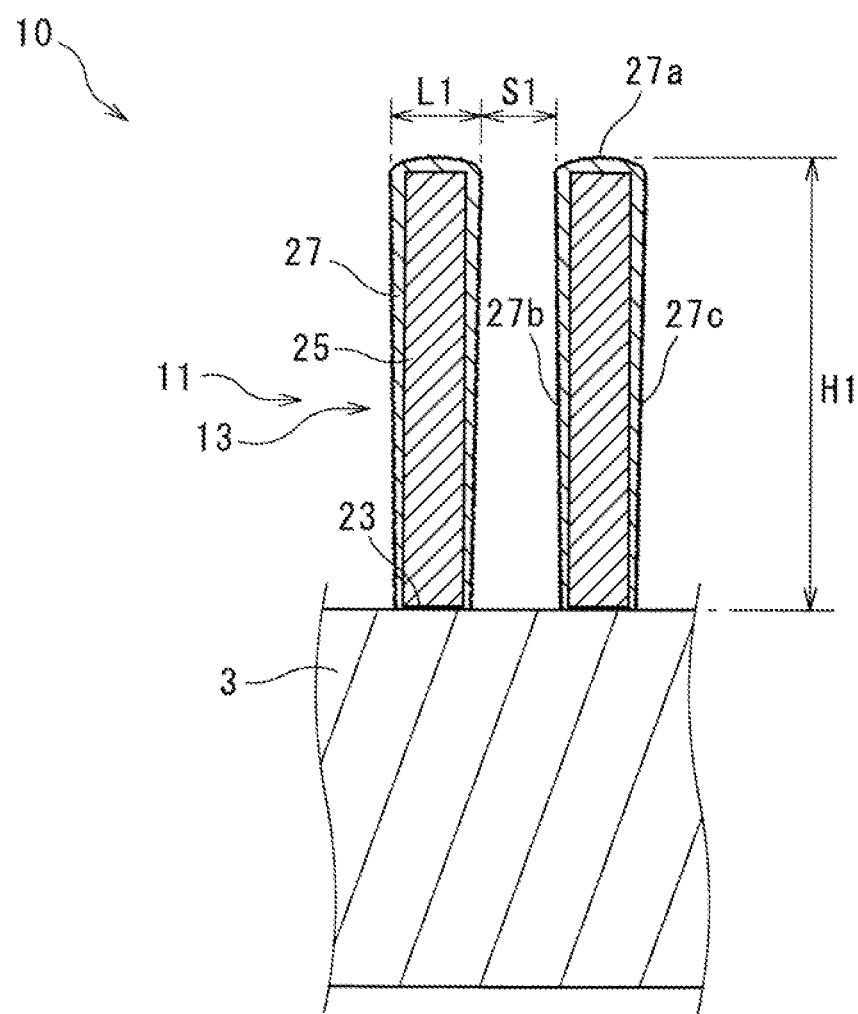
FIG. 2 is a schematic end view taken along line AA in FIG. 1.

FIG. 1 is a top view of a flexible printed wiring board 10 according to this embodiment. FIG. 2 is a schematic sectional view taken along line AA. As illustrated in FIGS. 1 and 2, the flexible printed wiring board 10 of this embodiment mainly includes an insulating base film 3 and a wiring layer 11 having a plurality of wiring lines 13 disposed (stacked) on one surface of the base film 3. The flexible printed wiring board 10 may further include an insulating film (covering film) on the front surface of the base film 3 or the wiring layer 11. The insulating film may be, for example, a publicly known resin film or the like, and the insulating film is bonded to the base film 3 or the wiring layer 11, for example, with an adhesive.

<Base Film>

The base film 3 is an insulating layer composed of a synthetic resin. The base film 3 has flexibility. This base film 3 also functions as a substrate on which the wiring layer 11 is formed. The material that forms the base film 3 may be any material having an insulating property and flexibility, and a synthetic resin film formed in a sheet shape and having a low dielectric constant can be used as the material. Examples of a main component of this synthetic resin film include polyimide, polyethylene terephthalate, liquid crystal polymers, and fluororesins. The "main component" refers to a component that has the highest content and means, for example, a component that accounts for 50% by mass or more in the forming material. The base film 3 may contain, for example, a resin other than the exemplified resins such as polyimide, and an antistatic agent.

The lower limit of the average thickness of the base film 3 is not particularly limited, and may be 3 μm, may be 5 μm, or may be 10 μm. The upper limit of the average thickness of the base film 3 is not particularly limited, and may be 200 μm, may be 150 μm, or may be 100 μm. If the average thickness of the base film 3 is less than 3 μm, the dielectric strength and mechanical strength of the base film 3 may become insufficient. On the other hand, if the average thickness of the base film 3 exceeds 200 μm, the thickness of the flexible printed wiring board 10 may unnecessarily increase. Herein, the "average thickness" means the average of thicknesses measured at 10 random points. Note that the "average thickness" of, for example, other members described below is also measured in a similar manner.

<Wiring Layer>

The wiring layer 11 is disposed (stacked) on the front surface of the base film 3 either directly or with another layer interposed therebetween. Examples of the wiring lines 13 included in the wiring layer 11 include signal lines for sending signals, current lines for sending a current for electric power supply, and current lines for sending a current for magnetic field generation.

Each of the wiring lines 13 is formed of a first conductive underlying layer 23 disposed (stacked) on the front surface of the base film 3, a first plating layer 25 disposed (stacked) on a surface of the first conductive underlying layer 23 opposite to the base film 3, and a second plating layer 27 disposed (stacked) so as to cover both side surfaces of the first conductive underlying layer 23, a surface of the first plating layer 25 opposite to the first conductive underlying layer 23, and both side surfaces of the first plating layer 25.

The cross section of each of the wiring lines 13 has, for example, a shape in which the width increases from a connection portion of the wiring line 13 to the base film 3 toward the front end of the wiring line 13, as illustrated in FIG. 2. In other words, the cross section has a shape tapered toward the base film 3. That is, the cross section has an inverted trapezoidal shape. Since the cross section has an inverted trapezoidal shape as described above, adhesiveness between both side surfaces of each wiring line 13 and the insulating film can be further increased. Accordingly, the flexible printed wiring board 10 has better adhesiveness to the insulating film. In the flexible printed wiring board 10 in FIG. 2, a thickness of the second plating layer 27 in a direction perpendicular to the side surfaces of the first plating layer 25 increases from a contact surface between the front surface of the base film and the second plating layer 27 towards a front end surface of the wiring line 13.

The lower limit of the average line width L1 of the wiring lines 13 may be 5 μm, may be 7.5 μm, or may be 10 μm. The upper limit of the average line width L1 of the wiring lines 13 may be 30 μm, may be 25 μm, or may be 20 μm. If the average line width L1 of the wiring lines 13 is less than 5 μm, it may become difficult to manufacture the wiring lines 13. On the other hand, if the average line width L1 of the wiring lines 13 exceeds 30 μm, a sufficient wiring density may not be achieved. The "average line width" is a value obtained by exposing a section of the flexible printed wiring board 10 with a section preparation device such as a microtome, measuring a length of a portion having the largest width in each wiring line 13 with, for example, a microscope with which the length can be measured, and averaging the measured values at ten random positions.

The lower limit of the average spacing S1 of a plurality of wiring lines 13 disposed to be adjacent to each other is 1 μm and further may be 2 μm. The upper limit of the average spacing S1 of the wiring lines 13 is 30 μm, and further may be 20 µm, or may be 10 µm. If the average spacing S1 of the wiring lines 13 is less than 1 µm, a short circuit may occur. On the other hand, if the average spacing S1 of the wiring lines 13 exceeds 30 µm, a sufficient wiring density may not be achieved. The "average spacing" is a value obtained by exposing a section of the flexible printed wiring board 10 with a section preparation device such as a microtome, measuring a length of a portion having the smallest spacing in the gap between wiring lines 13 with, for example, a microscope with which the length can be measured, and averaging the measured values.

The lower limit of the average height (thickness) H1 of the wiring lines 13 is 40 µm and further may be 50 µm. The upper limit of the average height H1 of the wiring lines 13 is 120 µm, and further may be 100 µm, may be 70 µm, or may be 60 µm. If the average height H1 is less than 40 µm, the mechanical strength may become insufficient. On the other hand, if the average height H1 exceeds 120 µm, it may become difficult to form the wiring lines 13 in the method of manufacturing a flexible printed wiring board 10 described later. The "average height" is obtained by exposing a section of the flexible printed wiring board 10 with a section preparation device such as a microtome, measuring a height (corresponds to a thickness) in wiring lines 13 by cross-sectional observation at ten random positions, and calculating the average of the measured results. Note that the "average height" of, for example, other members described below is also measured in a similar manner.

The first conductive underlying layer 23 is formed by a part of a conductive underlying layer M (see, for example, FIG. 3) described later. Examples of the material that forms the first conductive underlying layer 23 include copper (Cu), silver (Ag), gold (Au), nickel (Ni), titanium (Ti), chromium (Cr), and alloys thereof. With regard to these forming materials, the first conductive underlying layer 23 may include a layer (first layer) containing at least one selected from the group consisting of nickel, chromium, titanium, and silver on the side in contact with the base film 3 (for example, polyimide) from the viewpoint of suppressing thermal deterioration of adhesive strength of the wiring layer 11 to the base film 3. Furthermore, the first conductive underlying layer 23 may include a layer (first layer) containing at least one selected from nickel and chromium, which are easily removed to easily maintain insulation. In addition, the first conductive underlying layer 23 may include a layer (second layer) containing copper as a main component on the upper side (the side opposite to the base film 3) of this first layer. This configuration in which the layer containing copper as a main component is disposed can shorten the time of operation when the wiring layer 11 is formed by electroplating.

For example, the lower limit of the average thickness of the first layer may be 1 nm or may be 2 nm. The upper limit of the average thickness of the first layer may be 15 nm or may be 8 nm. If the average thickness is less than 1 nm, it may become difficult to suppress thermal deterioration of adhesive strength of the wiring layer 11 to the base film 3. On the other hand, if the average thickness exceeds 15 nm, it may become difficult to easily remove the first layer, and insulation of the wiring layer 11 may not be sufficiently maintained. This first layer can be formed by, for example, sputtering, electroplating, or electroless plating.

For example, the lower limit of the average thickness of the second layer may be 0.1 µm or may be 0.2 µm. The upper limit of the average thickness of the second layer may be 2 µm or may be 1 µm. If the average thickness is less than 0.1 µm, the time taken to form the wiring layer 11 by electroplating may become excessively long. On the other hand, if the average thickness exceeds 2 µm, it may become difficult to easily remove the second layer, and insulation of the wiring layer 11 may not be sufficiently maintained. This second layer may be formed by, for example, sputtering, electroplating, or electroless plating and may be formed by a combination of these methods. In particular, an electroless copper plating layer may be disposed on the uppermost surface side of the first conductive underlying layer 23. With this configuration, in the case where an inner layer inside the electroless copper plating layer is formed by sputtering, defects and the like that can be generated by the sputtering can be covered.

As a first metal material for forming the first plating layer 25, for example, copper, nickel, gold, silver, platinum, etc., can be used. Among these, copper, which is relatively inexpensive and has good electrical conductivity, and nickel, which is relatively inexpensive and has good corrosion resistance, are suitably used.

The first plating layer 25 is formed using a resist pattern as described later. Specifically, the first plating layer 25 is formed while two side surfaces extending in the longitudinal direction of the first plating layer 25 are in contact with the resist pattern.

As a second metal material for forming the second plating layer 27, for example, copper, nickel, gold, silver, platinum, etc., can be used as with the first metal material. Among these, copper, which is relatively inexpensive and has good electrical conductivity, and nickel, which is relatively inexpensive and has good corrosion resistance, are suitably used.

The second plating layer 27 is formed without using a resist pattern as described later.

In this embodiment, a front end surface 27a extending in the longitudinal direction of the second plating layer 27 corresponds to a front end surface extending in the longitudinal direction of each wiring line 13, and two side surfaces 27b and 27c (the right and left side surfaces in FIG. 2) extending in the longitudinal direction of the second plating layer 27 correspond to two side surfaces extending in the longitudinal direction of each wiring line 13. In this embodiment, these two side surfaces 27b and 27c each have an arithmetical mean roughness Ra of 0.05 to 2.0.

The lower limit of the arithmetical mean roughness Ra of each of the side surfaces 27b and 27c is 0.05 as described above and further may be 0.1. The upper limit of the arithmetical mean roughness Ra of each of the side surfaces 27b and 27c is 2.0 as described above and further may be 1.0 or may be 0.7. If Ra is less than 0.05, the adhesiveness to an insulating film may be poor. On the other hand, if Ra exceeds 2.0, high-frequency characteristics may be degraded. In addition, if Ra exceeds 2.0, a short circuit may occur between adjacent wiring lines 13. Ra is measured by a method described in Examples described later.

The arithmetical mean roughness Ra of the front end surface 27a of each wiring line 13 is not particularly limited. For example, the lower limit of the arithmetical mean roughness Ra of the front end surface 27a may be 0.05 or may be 0.1. The upper limit of Ra of the front end surface 27a may be 2.0, may be 1.0, or may be 0.7. If Ra is less than 0.05, the adhesiveness to an insulating film may not be sufficiently enhanced. On the other hand, if Ra exceeds 2.0, high-frequency characteristics may be degraded. The arithmetical mean roughness Ra of the front end surface 27a is measured by the same method as the method of measuring Ra of a side surface described in Examples described later without particularly cutting the base film except that the measuring object is changed from the side surface to the front end surface.

The arithmetical mean roughness Ra of each of the two side surfaces 27b and 27c and the front end surface 27a can be adjusted by adjusting an additive in a second plating solution and a current density, as described later.

<Advantages>

In the flexible printed wiring board 10, since the average height H1 and the average spacing S1 of the wiring lines 13 are within the ranges described above, and the arithmetical mean roughness Ra of each of the side surfaces 27b and 27c is within the range described above, a short circuit can be suppressed. In addition, when an insulating film is stacked so as to cover the wiring lines 13, the adhesiveness between the insulating film and the wiring lines 13 can be increased. Thus, the flexible printed wiring board 10 has good adhesiveness to the insulating film and is less likely to be short-circuited.

Second Embodiment

[Method of Manufacturing Flexible Printed Wiring Board]

Next, a method of manufacturing the flexible printed wiring board according to the first embodiment will be described.

The method of manufacturing a flexible printed wiring board 10 includes a first plating step of preparing a base film 3 having a conductive underlying layer M stacked on a front surface thereof, and forming a first plating layer 25 on the conductive underlying layer M on the base film 3 by electroplating in a first plating solution using a resist pattern R1; a first removal step (step of removal) of removing the resist pattern R1 and a region of the conductive underlying layer M, the region not having the first plating layer 25 thereon; and a second plating step of, after the first removal step, forming a second plating layer 27 on the first plating layer 25 by electroplating in a second plating solution. In this embodiment, the second plating solution contains polyethylene glycol having a number-average molecular weight of 2,500 to 8,000. In the second plating step, a current density of electroplating is adjusted such that side surfaces of the wiring lines 13 (here, two side surfaces 27b and 27c of the second plating layer 27) each have an arithmetical mean roughness Ra of 0.05 to 2.0.

<Conductive Underlying Layer>

The conductive underlying layer M is stacked on a front surface of the base film 3. The conductive underlying layer M used is a conductive underlying layer that is stacked in advance over the entire surface of the front surface of the base film 3. A part of the conductive underlying layer M serves as the first conductive underlying layer 23.

Examples of the material that forms the conductive underlying layer M include copper (Cu), silver (Ag), gold (Au), nickel (Ni), titanium (Ti), chromium (Cr), and alloys thereof. With regard to these forming materials, the conductive underlying layer M may include a layer (first layer) containing at least one selected from the group consisting of nickel, chromium, titanium, and silver on the side in contact with the base film 3 (for example, polyimide) from the viewpoint of suppressing thermal deterioration of adhesive strength of the wiring layer 11 to the base film 3. Furthermore, the conductive underlying layer M may include a layer (first layer) containing at least one selected from nickel and chromium, which are easily removed to easily maintain insulation. In addition, the conductive underlying layer M may include a layer (second layer) containing copper as a main component on the upper side (the side opposite to the base film 3) of this first layer. This configuration in which the layer containing copper as a main component is disposed can shorten the time of operation when the wiring layer 11 is formed by electroplating.

For example, the lower limit of the average thickness of the first layer may be 1 nm or may be 2 nm. The upper limit of the average thickness of the first layer may be 15 nm or may be 8 nm. If the average thickness is less than 1 nm, it may become difficult to suppress thermal deterioration of adhesive strength of the wiring layer 11 to the base film 3. On the other hand, if the average thickness exceeds 15 nm, it may become difficult to easily remove the first layer, and insulation of the wiring layer 11 may not be sufficiently maintained. This first layer can be formed by, for example, sputtering, electroplating, or electroless plating.

For example, the lower limit of the average thickness of the second layer may be 0.1 µm or may be 0.2 µm. The upper limit of the average thickness of the second layer may be 2 µm or may be 1 µm. If the average thickness is less than 0.1 µm, the time taken to form the wiring layer 11 by electroplating may become excessively long. On the other hand, if the average thickness exceeds 2 µm, it may become difficult to easily remove the second layer, and insulation of the wiring layer 11 may not be sufficiently maintained. This second layer may be formed by, for example, sputtering, electroplating, or electroless plating and may be formed by a combination of these methods. In particular, an electroless copper plating layer may be disposed on the uppermost surface side of the conductive underlying layer M. With this configuration, in the case where an inner layer inside the electroless copper plating layer is formed by sputtering, defects and the like that can be generated by the sputtering can be covered.

<First Plating Step>

This step includes a step of stacking a photoresist film on a front surface of a conductive underlying layer M, a step of forming a resist pattern having an inverted shape of a first plating layer 25 by exposure and development of the photoresist film, and a step of forming the first plating layer 25 by electroplating on the conductive underlying layer M in openings of the resist pattern.

(Step of Stacking Photoresist Film)

In the step of stacking a photoresist film, a photoresist film (not illustrated) is stacked on a front surface of a conductive underlying layer M.

The photoresist film is formed of a negative resist composition in which polymer bonds are strengthened by exposure with light and the solubility in a developing solution is thereby decreased, or a positive resist composition in which polymer bonds are weakened by exposure with light and solubility in a developing solution is thereby increased.

The photoresist film may be formed on the conductive underlying layer M by application and drying of a liquid resist composition, or by stacking, by hot press bonding, a dry film photoresist that does not have fluidity at room temperature. Since the thickness of the photoresist film can be made uniform and small by using a dry film photoresist as the photoresist film, a finer resist pattern is easily formed.

The lower limit of the average height (thickness) of the photoresist film may be 45 µm or may be 50 µm. On the other hand, the upper limit of the average height of the photoresist film may be 170 µm or may be 150 µm. If the average height of the photoresist film is less than 45 µm, handling of the dry film resist may become difficult. On the other hand, if the average height of the photoresist film exceeds 170 µm, the accuracy of the shape of the resist pattern may be degraded.

(Step of Forming Resist Pattern)

In the step of forming a resist pattern, first, the photoresist film is selectively exposed to light using, for example, a photomask to thereby form, in the photoresist film, portions that dissolve in a developing solution and portions that do not dissolve.

Figure 3:
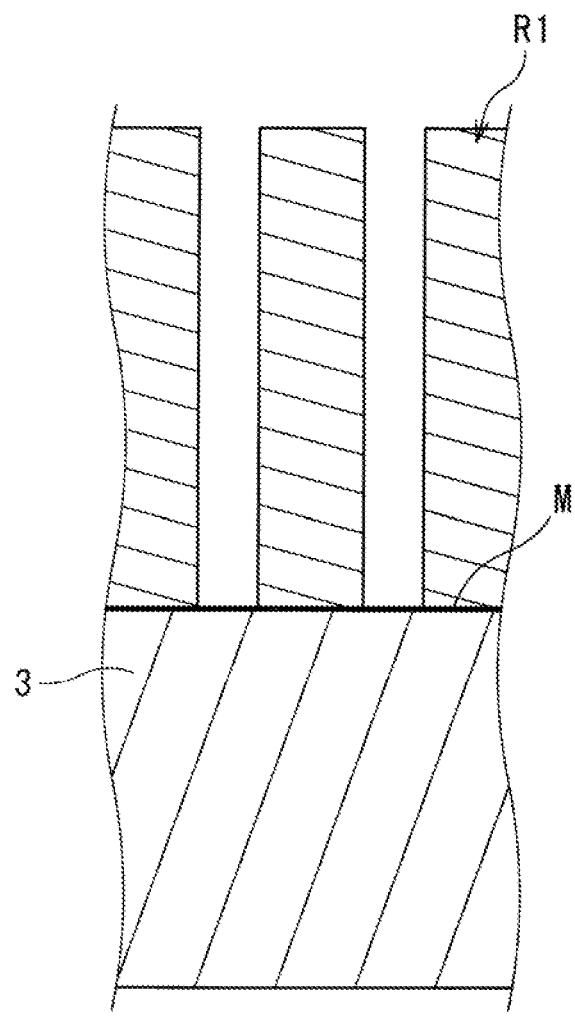
FIG. 3 is a schematic end view for describing a method of manufacturing the flexible printed wiring board in FIG. 2.

Subsequently, the portions of the photoresist film having high solubility are washed away with a developing solution to obtain a resist pattern R1 in which portions corresponding to the first plating layer 25 to be formed are formed as openings, as illustrated in FIG. 3.

The resist pattern R1 has a plurality of openings that define the first plating layer 25. The lower limit of the average width of the openings may be 5 µm, may be 10 µm, or may be 15 µm. On the other hand, the upper limit of the average width of the openings may be 50 µm, may be 40 µm, or may be 30 µm. If the average width of the openings is smaller than 5 µm, the variation in the widths of the openings may be increased, and in addition, the height of the second plating layer 27 (amount of secondary plating) is excessively large, and the variation in the dimensions and the manufacturing cost of the flexible printed wiring board may be increased. Contrarily, if the average width of the openings exceeds 50 µm, the resist pattern R1 may be more likely to be detached, and furthermore, the wiring density may not satisfy the requirement. The average width of the openings of the resist pattern R1 corresponding to the first plating layer 25 is equal to the average width of the first plating layer 25 before etching in the first removal step described later.

(Step of Forming First Plating Layer)

Figure 4:
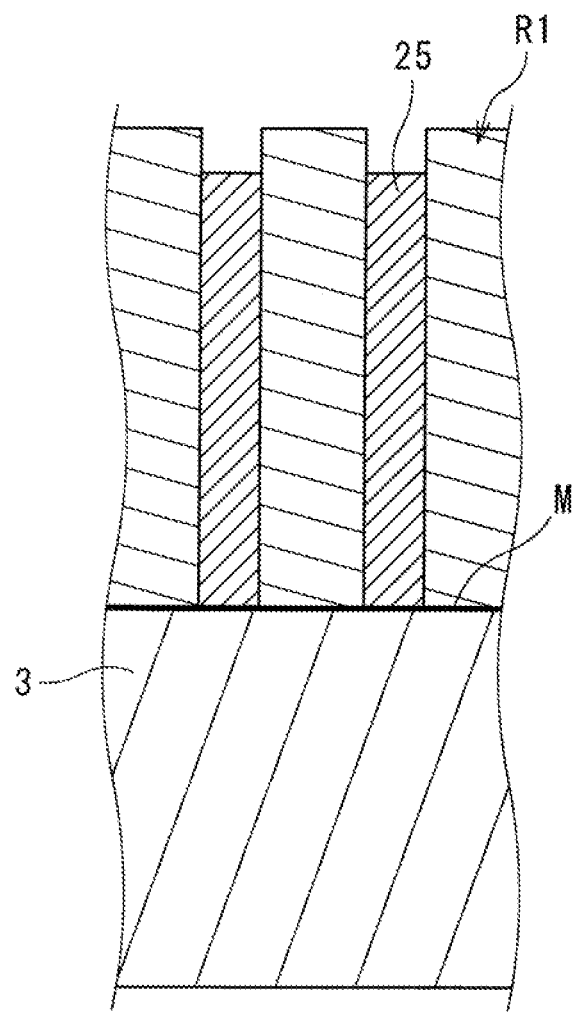
FIG. 4 is a schematic end view for describing the method of manufacturing the flexible printed wiring board in FIG. 2.

In the step of forming a first plating layer, a metal is stacked by electroplating on the conductive underlying layer M exposed in the openings of the resist pattern R1 using a first plating solution to form a first plating layer 25, as illustrated in FIG. 4.

Specifically, in this step of forming a first plating layer, a multilayered body having the base film 3, the conductive underlying layer M, and the resist pattern R1, and an electrode opposing the multilayered body are placed in a first plating solution, the negative electrode of a direct-current power supply is connected to the conductive underlying layer M, and the positive electrode is connected to the opposing electrode to cause the metal in the first plating solution to deposit on the front surface of the conductive underlying layer M.

As the metal to be stacked by electroplating, that is, as the first metal material for forming the first plating layer 25, for example, copper, nickel, gold, silver, platinum, etc. can be used, as described above. Among these, copper, which is relatively inexpensive and has good electrical conductivity, and nickel, which is relatively inexpensive and has good corrosion resistance, are suitably used.

The first plating solution may be a plating solution containing the first metal material and a first additive. Examples of the first additive include, in addition to polyethylene glycol described later, copper sulfate pentahydrate, sulfuric acid, chlorine ions (chloride ions), and disodium 3,3'-dithiobis(1-propanesulfonate) (SPS). As the first plating solution, the same plating solution as a second plating solution described later can be used.

The lower limit of the average height of the first plating layer 25 before etching formed in the step of forming a first plating layer may be 20 µm, may be 25 µm, or may be 30 µm.

On the other hand, the upper limit of the average height of the first plating layer 25 before etching may be 125 µm, may be 120 µm, or may be 118 µm. If the average height of the first plating layer 25 before etching is smaller than 20 µm, the height of the second plating layer 27 (amount of secondary plating) becomes excessively large, and the variation in the dimensions and the manufacturing cost of the flexible printed wiring board may be increased. Contrarily, if the average height of the first plating layer 25 before etching exceeds 125 µm, the resist pattern R1 may be less likely to be stripped, and the thickness of the flexible printed wiring board 10 may unnecessarily increase.

<First Removal Step>

Figure 5:
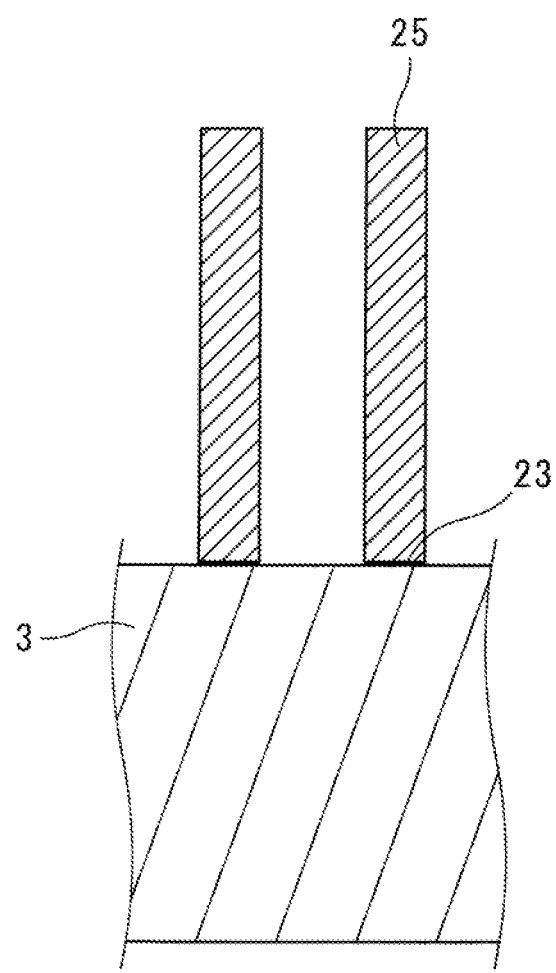
FIG. 5 is a schematic end view for describing the method of manufacturing the flexible printed wiring board in FIG. 2.

In the first removal step, after the formation of the first plating layer 25, the resist pattern R1 and the conductive underlying layer M located at a bottom portion of the resist pattern R1 are removed as illustrated in FIG. 5.

The removal of the resist pattern R1 is performed by stripping the resist pattern R1 from the conductive underlying layer M. Specifically, a multilayered body having the resist pattern R1, the first plating layer 25, the conductive underlying layer M, and the base film 3 is immersed in a stripping solution to swell the resist pattern R1 with the stripping solution. As a result, repulsive force is generated between the resist pattern R1 and the conductive underlying layer M, and the resist pattern R1 is stripped from the conductive underlying layer M. A publicly known stripping solution can be used as the stripping solution.

The conductive underlying layer M located at the bottom portion of the resist pattern R1 is removed by etching the conductive underlying layer M exposed after the stripping of the resist pattern R1 using the first plating layer 25 serving as a mask. Consequently, a plurality of the first plating layers 25 are electrically separated from each other. An etchant that corrodes the metal forming the conductive underlying layer M is used for this etching.

The amount of etching is not limited as long as the conductive underlying layer M is completely removed, but in the method of manufacturing a flexible printed wiring board 10, an average amount of etching of the first plating layer 25 may be 0.5 µm or more and less than 3.0 µm. The average amount of etching may be 2.0 µm or less. Note that the "average amount of etching of the first plating layer" is a value obtained by averaging, in the longitudinal directions of wiring lines, a thickness determined by dividing the difference between the area of the first plating layer before etching and the area of the first plating layer after etching in a section perpendicular to the longitudinal direction of the wiring lines by the length of an outer surface (excluding the stacking surface on the base film) of the first plating layer before etching.

<Second Plating Step>

In the second plating step, the surface of the first plating layer 25 is coated with a second plating layer 27 by electroplating using a second plating solution to form wiring lines 13. This electroplating can be performed using, for example, a publicly known electroplating method by adjusting the current density as described later. As a result, the flexible printed wiring board 10 in FIG. 2 as described above is obtained. In the manufacturing method of the embodiment, the so-called semi-additive method is suitably used in this manner.

As the metal to be stacked by electroplating, that is, as a second metal material for forming the second plating layer 27, for example, copper, nickel, gold, silver, platinum, etc. can be used, as described above. Among these, copper, which is relatively inexpensive and has good electrical conductivity, and nickel, which is relatively inexpensive and has good corrosion resistance, are suitably used.

The second plating solution used in this electroplating contains polyethylene glycol (PEG) having a number-average molecular weight of 2,500 to 8,000. The second plating solution may be a plating solution containing the second metal material and polyethylene glycol serving as a second additive. Examples of the second additive other than polyethylene glycol include copper sulfate pentahydrate, sulfuric acid, chlorine ions (chloride ions), and disodium 3,3'-dithiobis(1-propanesulfonate) (SPS) as with the first additive described above.

The lower limit of the number-average molecular weight Mn of polyethylene glycol is 2,500 and further may be 2,700, or may be 3,000. The upper limit of the number-average molecular weight Mn is 8,000 and further may be 7,000, or may be 5,000. If the number-average molecular weight Mn is less than 2,500, it may become difficult to set the arithmetical mean roughness Ra of each of the two side surfaces 27b and 27c and the front end surface 27a of the second plating layer 27 within the range described above. On the other hand, if the number-average molecular weight Mn exceeds 8,000, it may also become difficult to set the arithmetical mean roughness Ra of each of the two side surfaces 27b and 27c and the front end surface 27a of the second plating layer 27 within the range described above.

For example, the lower limit of the weight-average molecular weight Mw of polyethylene glycol may be 10,000 or may be 10,100. The upper limit of the weight-average molecular weight Mw may be 20,000, may be 18,000, may be 16,000, or may be 15,000. If the weight-average molecular weight Mw is less than 10,000, it may become difficult to set the arithmetical mean roughness Ra of each of the two side surfaces 27b and 27c and the front end surface 27a of the second plating layer 27 within the range described above. On the other hand, if the weight-average molecular weight Mw exceeds 20,000, it may also become difficult to set the arithmetical mean roughness Ra of each of the two side surfaces 27b and 27c and the front end surface 27a of the second plating layer 27 within the range described above.

For example, the lower limit of the z-average molecular weight Mz of polyethylene glycol may be 15,000 or may be 16,000. The upper limit of the z-average molecular weight Mz may be 25,000, may be 22,000, or may be 20,000. If the z-average molecular weight Mz is less than 15,000, it may become difficult to set the arithmetical mean roughness Ra of each of the two side surfaces 27b and 27c and the front end surface 27a of the second plating layer 27 within the range described above. On the other hand, if the z-average molecular weight Mz exceeds 25,000, it may also become difficult to set the arithmetical mean roughness Ra of each of the two side surfaces 27b and 27c and the front end surface 27a of the second plating layer 27 within the range described above.

The current density in the second plating step is not particularly limited and can be appropriately set. For example, the lower limit of the current density may be 0.3 A/m$^2$, may be 0.5 A/m$^2$, or may be 1 A/m$^2$ in total. The upper limit of the current density may be 5 A/m$^2$, may be 4 A/m$^2$, or may be 3 A/m$^2$ in total. If the current density is less than 0.3 A/m$^2$, it may become difficult to set the arithmetical mean roughness Ra of each of the two side surfaces 27b and 27c and the front end surface 27a of the second plating layer 27 within the range described above. On the other hand, if the current density exceeds 5 A/m$^2$, it may also become difficult to set the arithmetical mean roughness Ra of each of the two side surfaces 27b and 27c and the front end surface 27a of the second plating layer 27 within the range described above.

In the second plating step, the current density may be adjusted in one stage or may be adjusted in two stages. By adjusting the current density in the second plating step in two stages in this manner, the arithmetical mean roughness Ra is easily adjusted within the range described above. In the case where the current density is adjusted in one stage, the upper limit and the lower limit of the current density may be in the ranges described above.

In the case where the current density is adjusted in two stages, the current density in the second stage may be larger than the current density in the first stage. In this case, for example, the lower limit of the current density in the first stage may be 0.1 A/m$^2$ or may be 0.3 A/m$^2$. The upper limit of the current density in the first stage may be 1.5 A/m$^2$ or may be 1.0 A/m$^2$. The lower limit of the current density in the second stage may be 0.2 A/m$^2$ or may be 1.0 A/m$^2$. The upper limit of the current density in the second stage may be 5 A/m$^2$ or may be 3 A/m$^2$.

<Advantages>

The method of manufacturing a flexible printed wiring board 10 enables the manufacturing of a flexible printed wiring board 10 that has good adhesiveness to an insulating film and that is less likely to be short-circuited. According to the method of manufacturing a flexible printed wiring board 10, even in a relatively dense wiring pattern (in which the average height of wiring lines is 40 µm to 120 µm, and the average spacing between wiring lines is 1 µm to 30 µm), the side surfaces of the wiring lines can be adjusted to have a predetermined surface roughness.

Third Embodiment

[Flexible Printed Wiring Board]

Figure 6:
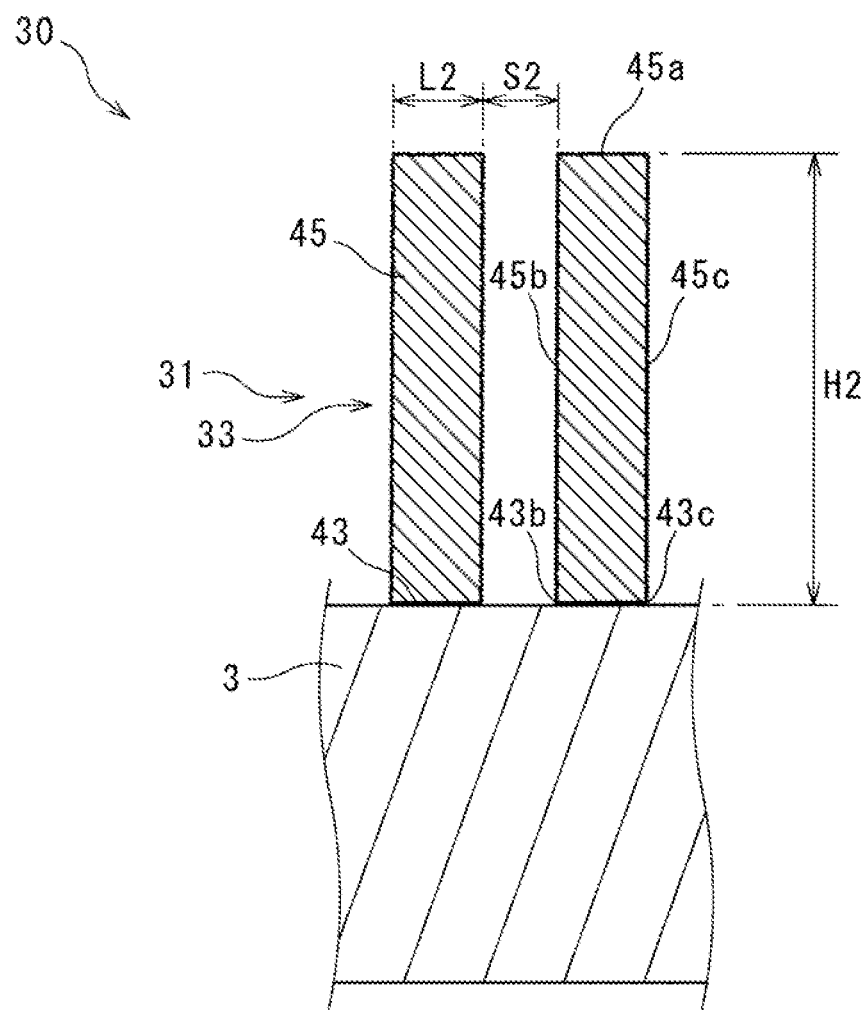
FIG. 6 is a schematic end view illustrating a flexible printed wiring board according to a third embodiment.

As illustrated in FIG. 6, a flexible printed wiring board 30 of this embodiment mainly includes an insulating base film 3 and a wiring layer 31 having a plurality of wiring lines 33 disposed (stacked) on one surface of the base film 3.

The flexible printed wiring board 30 may further include an insulating film (covering film) on the front surface of the base film 3 or the wiring layer 31 as in the first embodiment described above.

In the flexible printed wiring board 30 of this embodiment, the wiring lines 33 each have a second conductive underlying layer 43 and a single-layer third plating layer 45 disposed on the second conductive underlying layer 43.

<Base Film>

The base film 3 of this embodiment is the same as the base film 3 of the first embodiment, and thus a detailed description thereof is omitted.

<Wiring Layer>

The wiring layer 31 is disposed (stacked) on the front surface of the base film 3 either directly or with another layer interposed therebetween. As in the first embodiment described above, examples of the wiring lines 33 included in the wiring layer 31 include signal lines for sending signals, current lines for sending a current for electric power supply, and current lines for sending a current for magnetic field generation.

Each of the wiring lines 33 is formed of a second conductive underlying layer 43 disposed (stacked) on the front surface of the base film 3, and a third plating layer 45 disposed (stacked) on a surface of the second conductive underlying layer 43 opposite to the base film 3.

The average line width L2, the average spacing S2, and the average height H2 of the wiring lines 33 can be set as in the wiring lines 13 of the first embodiment.

As the material that forms the second conductive underlying layer 43, the same material as that of the first conductive underlying layer 23 of the first embodiment can be used.

As a third metal material for forming the third plating layer 45, the same materials as the first metal material and the second metal material for forming the first plating layer 25 and the second plating layer 27, respectively, of the first embodiment can be used.

In this embodiment, two side surfaces (the right and left side surfaces in FIGS. 6) 43b and 43c extending in the longitudinal direction of the second conductive underlying layer 43 and two side surfaces (the right and left side surfaces in FIGS. 6) 45b and 45c extending in the longitudinal direction of the third plating layer 45 correspond to two side surfaces extending in the longitudinal direction of each wiring line 33. A front end surface 45a extending in the longitudinal direction of the third plating layer 45 corresponds to a front end surface extending in the longitudinal direction of each wiring line 33.

In this embodiment, the two side surfaces of each of the wiring lines 33 have an arithmetical mean roughness Ra of 0.05 to 2.0 as in the first embodiment described above.

The lower limit of the arithmetical mean roughness Ra of each of the side surfaces of the wiring line 33 is 0.05 and further may be 0.1 as in the first embodiment described above. The upper limit of Ra of each of the side surfaces is 2.0 and further may be 1.0 or may be 0.7 as in the first embodiment.

The lower limit of the arithmetical mean roughness Ra of the front end surface (here, the front end surface 45a of the third plating layer 45) of the wiring line 33 may be 0.05 or may be 1.0 as in the first embodiment described above. The upper limit of Ra of the front end surface may be 2.0, may be 1.0, or may be 0.7 as in the first embodiment described above.

The arithmetical mean roughness Ra of each of the portions corresponding to the two side surfaces and the front end surface of the wiring line 33 can be adjusted by adjusting etching conditions as described later.

[Method of Manufacturing Flexible Printed Wiring Board]

Next, a method of manufacturing a flexible printed wiring board 30 according to the third embodiment will be described.

The method of manufacturing a flexible printed wiring board 30 includes a third plating step of forming a third plating layer 45 on a conductive underlying layer M of a base film 3 having the conductive underlying layer M stacked on one surface thereof by electroplating in a third plating solution using a resist pattern R2 (not illustrated); a second removal step of removing the resist pattern R2, and a region of the conductive underlying layer M, the region not having the third plating layer 45 thereon; and after the second removal step, a surface roughness adjusting step of adjusting an arithmetical mean roughness Ra of a surface of the third plating layer 45. In the surface roughness adjusting step, the surface roughness of the third plating layer 45 is adjusted such that Ra of each side surface of the third plating layer 45 is 0.05 to 2.0.

In this embodiment, the surface roughness of each of the third plating layer 45 and the second conductive underlying layer 43 is adjusted such that Ra of each side surface of the wiring lines 33 is 0.05 to 2.0.

In this embodiment, the surface roughness of the third plating layer 45 is adjusted such that Ra of the front end surface of each of the wiring lines 33 (that is, the front end surface 45a of the third plating layer 45) is 0.05 to 2.0.

<Conductive Underlying Layer>

As the conductive underlying layer M, the same conductive underlying layer as that in the second embodiment described above is used. A part of the conductive underlying layer M serves as the second conductive underlying layer 43.

<Third Plating Step>

In this step, a step similar to the first plating step of the second embodiment is performed. This step provides a multilayered body in which the third plating layer 45 is stacked in the openings of the resist pattern R2 (not illustrated) on the conductive underlying layer M.

<Second Removal Step>

In the second removal step, a step similar to the first removal step of the second embodiment described above is performed. Through this step, the resist pattern R2 and the conductive underlying layer M located at a bottom portion of the resist pattern R2 are removed.

<Surface Roughness Adjusting Step>

In this step, both the side surfaces 43b and 43c of the second conductive underlying layer 43, and both the side surfaces 45b and 45c and the front end surface 45a of the third plating layer 45 are etched to adjust the surface roughness of these surfaces. An etchant such as sulfuric acid/hydrogen peroxide is used for this etching. Through this step, the arithmetical mean roughness Ra of each of the two side surfaces extending in the longitudinal direction of each of the wiring lines 33 is adjusted within the range described above. In addition to this, the arithmetical mean roughness Ra of the front end surface of each of the wiring lines 33 is adjusted within the range described above.

Note that the surface roughness adjusting step and etching of the conductive underlying layer M in the second removal step may be performed at the same time.

<Advantages>

In the flexible printed wiring board 30, since the average height H2 and the average spacing S2 of the wiring lines 33 are within the ranges described above, and the arithmetical mean roughness Ra of each of the side surfaces is within the range described above, a short circuit can be suppressed. In addition, when an insulating film is stacked so as to cover the wiring lines 33, adhesiveness between the insulating film and the wiring lines 33 can be increased. Thus, the flexible printed wiring board 30 has good adhesiveness to the insulating film and is less likely to be short-circuited.

Other Embodiments

In the embodiments, a description has been made of a flexible printed wiring board that includes a single base film and a wiring layer stacked on one of surfaces of the base film; however, the flexible printed wiring board 10 may include a single base film and wiring layers stacked on both surfaces of the base film. Alternatively, the flexible printed wiring board 10 may be a multilayer printed wiring board including a plurality of base films, each of which has a plurality of wiring layers on one surface or both surfaces thereof. In this case, the wiring layers on both surfaces can be electrically connected to each other via land parts.

In the embodiments, the case where a single wiring layer is stacked on a base film has been described. Alternatively, a plurality of wiring layers may be stacked on a base film so as to be spaced apart from each other.

In the embodiments, the case where the wiring layers 11 and 31 include the wiring lines 13 and 33, respectively, has been described; however, an aspect in which the wiring layers 11 and 31 include wiring lines other than the wiring lines 13 and 33, respectively, can also be employed.

It is to be understood that the embodiments disclosed herein are only illustrative and non-restrictive in all respects. The scope of the present invention is not limited to the configurations of the embodiments but is defined by the claims, and is intended to include meaning equivalent to the scope of the claims and all modifications within the scope.

EXAMPLES

<Preparation of Samples>

Reference Examples 1 and 2, Comparative Examples 1 and 2, and Examples 1 to 4

A film (UPILEX (registered trade mark)-S, manufactured by Ube Industries, Ltd.) including a base film and a conductive underlying layer stacked on one surface side (front surface side) of the base film was used to prepare wiring boards each illustrated in FIG. 2, that is, wiring boards each including a wiring layer having a plurality of wiring lines formed of first and second plating layers that are stacked on the conductive underlying layer of the film, by the same manufacturing method as the method described in the second embodiment. Specifically, the wiring boards were prepared as follows.

(Plating Solution)

A plating solution having the composition described below was used, and the type of PEG was changed as shown in Table 1. Molecular weights of PEG shown in Table 1 were each measured by the method described below.

Copper sulfate pentahydrate: 75 g/L
Sulfuric acid: 190 g/L
Hydrochloric acid (source of supply of chloride ions): 55 mg/L
PEG: 0.02 mmol/L
Disodium 3,3'-dithiobis(1-propanesulfonate) (SPS): 0.5 mmol/L
Janus Green B (JGB): 0.05 mmol (Measurement of Number-Average Molecular Weight Mn, Weight-Average Molecular Weight Mw, and Z-Average Molecular Weight Mz of PEG)

The number-average molecular weight Mn, the weight-average molecular weight Mw, and the z-average molecular weight Mz of PEG were measured by a GPC method (gel permeation chromatography). An undiluted PEG used as a sample was neutralized (a salt was precipitated) and then centrifuged, and the resulting supernatant was collected and then filtered with a filter to prepare a sample solution. The measurement conditions are described below. The following gel permeation chromatograph GPC apparatus was used, the following detector and columns were prepared, the following aqueous sodium nitrate solution was used as a solvent, the flow rate was set as follows, and the sample solution was injected in the following injection amount.

The column temperature was set as follows.

Measurement Conditions

Apparatus: Gel permeation chromatograph GPC (Instrument No. GPC-28)
Detector: Differential refractive index detector RI (RI-201, manufactured by SHOWA DENKO K.K., sensitivity: 32)
Column: TSKgel G3000PWXL, two columns (7.8 mm×30 cm, manufactured by Tosoh Corporation)
Solvent: 0.1 M aqueous sodium nitrate solution Flow rate: 0.7 mL/min
Column temperature: 23° C.
Amount of injection: 0.2 mL
Standard sample: Monodisperse polyethylene oxide (PEO) and polyethylene glycol (PEG) manufactured by Tosoh Corporation, Agilent Technologies, Inc., and Sigma Aldrich The number-average molecular weight Mn, the weight-average molecular weight Mw, and the z-average molecular weight Mz were calculated from a molecular weight distribution curve after measurement as represented in the following definitional equations. In each of the equations, Mi represents a molecular weight at each elution position of a GPC curve obtained through a molecular weight calibration curve, and Ni represents the number of molecules.

$$Mn = \Sigma(Ni \cdot Mi)/\Sigma Ni$$

$$Mw = \Sigma(Ni \cdot Mi^2)/\Sigma(Ni \cdot Mi)$$

$$Mz = \Sigma(Ni \cdot Mi^3)/\Sigma(Ni \cdot Mi^2)$$

(Plating Conditions)

The following plating conditions were used.
Temperature of plating bath: 25° C.
Anode: Inert anode
Current density (ASD): Changed as shown in Table 1

(Formation of First Plating Layer)

A first plating layer was formed on the conductive underlying layer by electroplating using a resist pattern and using each plating solution under respective plating conditions while supplying electricity to the conductive underlying layer of the film as in the first plating step of the second embodiment described above. Subsequently, the resist pattern was stripped, and etching of the conductive underlying layer was performed by using the first plating layer as a mask as in the first removal step of the second embodiment described above.

(Formation of Second Plating Layer)

Subsequently, a second plating layer was formed by electroplating as in the second plating step of the second embodiment described above, using the same corresponding conditions as those in the formation of the first plating layer. In this manner, the plating solution and plating conditions used in the formation of each first plating layer were used as they are for forming the corresponding second plating layer.

The plating conditions were changed as shown in Table 1 to prepare, as measurement samples, wiring boards of Reference Examples 1 and 2 having wiring lines with both side surfaces having a large surface roughness, Comparative Examples 1 and 2, and Examples 1 to 4.

The average spacing and the average height of the wiring lines after the formation of the second plating layer are as shown in Table 1.

<Evaluation>

For each of the wiring boards, the arithmetical mean roughness Ra of a side surface of a wiring line, a short-circuit ratio, and adhesiveness (adhesion) of an insulating film were evaluated by the methods described below.

(Measurement of Arithmetical Mean Roughness Ra of Side Surface of Wiring Line)

The base film near wiring lines was cut with a cutter in the longitudinal direction of the wiring lines such that a side surface of any one of the wiring lines could be observed. The arithmetical mean roughness Ra was measured at five random positions of the side surface of the wiring line with a laser microscope (shape measurement laser microscope, VK-X100, manufactured by KEYENCE CORPORATION)

in accordance with JIS B0601 (2013). The average of the obtained values of the arithmetical mean roughness Ra at the five positions was calculated as the arithmetical mean roughness Ra (μm) of the side surface of the wiring line. The results are shown in Table 1.

(Short-Circuit Ratio)

For each of the wiring boards, the resistance was measured by a four point probe method to determine the short-circuit ratio (%). The results are shown in Table 1.

(Adhesion of Insulating Film)

An acrylic adhesive was applied to each of the wiring lines to have a thickness of 30 μm, and a polyimide film serving as an insulating film and having a thickness of 5 μm was then pressure-bonded thereon. Thus, the insulating film was bonded to each of the wiring boards of Reference Examples 1 and 2, Comparative Examples 1 and 2, and Examples 1 to 4 so as to cover the wiring lines. After bonding, a peel test was performed as described below. The result was evaluated as "1" when the area of a peeled portion of the insulating film was 100 mm² or more, evaluated as "2" when the area was 50 mm² or more and less than 100 mm², evaluated as "3" when the area was 20 mm² or more and less than 50 mm², evaluated as "4" when the area was 10 mm² or more and less than 20 mm², and evaluated as "5" when the area was less than 10 mm² (the case of 0 mm² was also included). A larger numerical values of the evaluation result indicates better adhesion. The results are shown in Table 1.

height was 40 μm or more, showed that a short circuit was suppressed, and good adhesion to the insulating film was achieved when the arithmetical mean roughness Ra of a side surface of a wiring line was 0.05 μm to 2.0 μm.

REFERENCE SIGNS LIST 10, 30 flexible printed wiring board, 3 base film, 11, 31 wiring layer, 13, 33 wiring line, 23 first conductive underlying layer, 25 first plating layer, 27 second plating layer, 27a front end surface, 27b, 27c side surface, 43 second conductive underlying layer, 43b, 43c side surface, 45 third plating layer, 45a front end surface, 45b, 45c side surface, H1, H2 average height, L1, L2 average line width, S1, S2 average spacing, M conductive underlying layer, R1 resist pattern

The invention claimed is:

1. A flexible printed wiring board comprising a base film and a plurality of wiring lines disposed on a front surface of the base film,
wherein each of the wiring lines has a front end surface extending in a longitudinal direction of the wiring line and two side surfaces extending in the longitudinal direction, and the side surfaces have an arithmetical mean roughness Ra of 0.05 μm to 2.0 μm,
the wiring lines have an average height of 40 μm to 120 μm,

TABLE 1

| | Ra [μm] | PEG Number-average molecular weight | PEG Weight-average molecular weight | PEG Z-average molecular weight | Current density [ASD] First time | Current density [ASD] Second time | Average spacing of wiring lines [μm] | Average height of wiring lines [μm] | Short-circuit ratio [%] | Adhesion |
|---|---|---|---|---|---|---|---|---|---|---|
| Reference Example 1 | 3.0 | 1000 | 2800 | 6540 | 2 | — | 50 | 50 | 0 | 5 |
| Reference Example 2 | 3.0 | 1000 | 2800 | 6540 | 2 | — | 50 | 30 | 0 | 5 |
| Comparative Example 1 | 3.0 | 1000 | 2800 | 6540 | 2 | — | 5 | 60 | 100 | 5 |
| Comparative Example 2 | 0.03 | 10100 | 20210 | 26590 | 2 | — | 5 | 60 | 0 | |
| Example 1 | 0.8 | 3000 | 10150 | 17500 | 2 | — | 5 | 60 | 20 | 4 |
| Example 2 | 1.0 | 3000 | 10150 | 17500 | 1.5 | — | 5 | 60 | 35 | 4 |
| Example 3 | 0.1 | 3000 | 10150 | 17500 | 0.1 | 2 | 5 | 60 | 0 | 5 |
| Example 4 | 0.23 | 4500 | 14980 | 19700 | 0.1 | 2 | 5 | 60 | 0 | 5 |

As shown in Table 1, Reference Examples 1 and 2, in which the average spacing of the wiring lines exceeded 30 μm, showed that a short circuit was suppressed, and good adhesion was also achieved. Thus, the results showed that in the case where the average spacing of the wiring lines was relatively large, namely more than 30 μm, and the case where the average height was relatively small, namely less than 40 μm, even when the arithmetical mean roughness Ra of a side surface of a wiring line exceeded 2.0, a short circuit did not occur.

However, Comparative Example 1, in which the average spacing of the wiring lines was 30 μm or less, showed that a large short circuit occurred when the arithmetical mean roughness Ra exceeded 2.0. In addition, Comparative Example 2, in which the average spacing of the wiring lines was 30 μm or less, showed that, although a short circuit was suppressed, the adhesion was poor when the arithmetical mean roughness Ra was less than 0.05 μm.

In contrast to this, Examples 1 to 4, in which the average spacing of the wiring lines was 30 μm or less and the average the wiring lines have an average spacing of 1 μm to 30 μm, and
wherein a width of each of the wiring lines increases from the front surface of the base film toward the front end surface in a section perpendicular to the longitudinal direction.

2. The flexible printed wiring board according to claim 1, wherein the front end surface has an arithmetical mean roughness Ra of 0.05 μm to 2.0 μm.

3. The flexible printed wiring board according to claim 1, wherein the wiring lines have an average line width of 5 μm to 30 μm.

4. The flexible printed wiring board according to claim 1, wherein the wiring lines have an average height of 40 μm to 60 μm.

5. The flexible printed wiring board according to claim 1, wherein each of the wiring lines includes a first conductive underlying layer stacked on the front surface of the base film, a first plating layer stacked on a surface of the first conductive underlying layer opposite to the base film, and a second plating layer stacked so as to cover both side surfaces of the first conductive underlying layer, a surface of the first plating layer opposite to the first conductive underlying layer, and both side surfaces of the first plating layer, and a front end surface and side surfaces of the second plating layer respectively correspond to the front end surface and the side surfaces of the wiring line.

6. The flexible printed wiring board according to claim 5, wherein a thickness of the second plating layer in a direction perpendicular to the side surfaces of the first plating layer increases from a contact surface between the front surface of the base film and the second plating layer towards the front end surface.

7. The flexible printed wiring board according to claim 1, wherein each of the wiring lines includes a second conductive underlying layer stacked on the front surface of the base film, and a third plating layer stacked on a surface of the second conductive underlying layer opposite to the base film, and a front end surface of the third plating layer corresponds to the front end surface of the wiring line, and side surfaces of the second conductive underlying layer and the third plating layer correspond to the side surfaces of the wiring line.

* * * * *